(12) United States Patent
Hummler

(10) Patent No.: US 6,724,030 B2
(45) Date of Patent: Apr. 20, 2004

(54) SYSTEM AND METHOD FOR BACK-SIDE CONTACT FOR TRENCH SEMICONDUCTOR DEVICE CHARACTERIZATION

(75) Inventor: Klaus Hummler, Poughkeepsie, NY (US)

(73) Assignee: Infineon Technologies North American Corp., San Jose, CA (US)

(*) Notice: Subject to any disclaimer, the term of this patent is extended or adjusted under 35 U.S.C. 154(b) by 0 days.

(21) Appl. No.: 10/051,544

(22) Filed: Jan. 18, 2002

(65) Prior Publication Data

US 2003/0136993 A1 Jul. 24, 2003

(51) Int. Cl.[7] .................. H01L 27/108; H01L 29/94
(52) U.S. Cl. ..................... 257/301; 257/296; 257/48
(58) Field of Search ..................... 257/48, 68, 71, 257/301–305, 905–906; 324/537, 765–769, 158; 714/5, 42, 718–723, 763, 773; 438/18, 243, 700

(56) References Cited

U.S. PATENT DOCUMENTS

| | | | | |
|---|---|---|---|---|
| 5,990,562 A | * | 11/1999 | Vallett | 257/774 |
| 6,078,057 A | * | 6/2000 | Vallett | 257/48 |
| 6,277,659 B1 | * | 8/2001 | Goruganthu et al. | 438/14 |
| 6,545,490 B1 | * | 4/2003 | Bruce | 324/750 |
| 6,599,778 B2 | * | 7/2003 | Pogge et al. | 438/118 |
| 2001/0006233 A1 | * | 7/2001 | Vallett | 257/48 |
| 2003/0111733 A1 | * | 6/2003 | Pogge et al. | 257/774 |

* cited by examiner

Primary Examiner—Nathan J. Flynn
Assistant Examiner—Johannes Mondt

(57) ABSTRACT

A method for forming a back-side contact for a vertical trench device includes grinding a back-side of a semiconductor substrate, milling a trench in the back-side of the semiconductor substrate, wherein a vertical trench fill is exposed, and depositing a conductive material, wherein the conductive material shorts the vertical trench fill to a buried plate. Grinding the back-side of the semiconductor substrate further includes grinding a dimple beneath a portion of the vertical trench device, wherein the trench is milled in the bottom portion of the dimple.

5 Claims, 4 Drawing Sheets

SYSTEM AND METHOD FOR BACK-SIDE CONTACT FOR TRENCH SEMICONDUCTOR DEVICE CHARACTERIZATION

BACKGROUND OF THE INVENTION

1. Field of the Invention

The present invention relates to semiconductor devices, and more particularly to determining parameters of a trench semiconductor device.

2. Discussion of Related Art

In vertical trench Dynamic Random Access Memory (DRAM) devices, the DRAM is built into sidewalls of storage trenches. In trench DRAM technology the source side of the array device is floating and connected to a storage capacitor. In order to determine the parameters of such a device, the source needs to be accessed.

Accessing the back-side or source side of a device to extract the device parameters can be difficult. Typically, devices are measured in a back-to-back mode where the source side of each device is wired to the silicon (Si) surface by a second device. However, it can be difficult to determine device parameters from a single device in such an arrangement.

According to another approach, the trench geometry is altered, where the trench functions as a wire connecting the source to the front of the die. However, in the implementation of this approach, several levels of a macro design are modified wherein the macro design deviates drastically from the actual product design. For example, macro designs at the vertical trench level may be altered such that the source can be wired laterally to the side and up to the Si surface. Thus, the periodic arrangement of vertical trench may be interrupted. Further, the patterning of the Si substrate, or active area, may be altered. These alterations can influence the structure and surroundings of the array device. Thus, device parameters recovered using this approach may fail to accurately model the product design.

Therefore, a need exists for a system and method of recovering device parameters without substantially modifying the design of a test device from that of the product design.

SUMMARY OF THE INVENTION

According to an embodiment of the present invention, a method is provided for forming a back-side contact for a vertical trench device. The method comprises grinding a backside of a semiconductor substrate, milling a trench in the backside of the semiconductor substrate, wherein a vertical trench fill is exposed, and depositing a conductive material, wherein the conductive material shorts the vertical trench fill to a buried plate.

The conductive material is a back-side electrode.

Grinding the back-side of the semiconductor substrate further comprises grinding a dimple beneath a portion of the vertical trench device, wherein the trench is milled in the bottom portion of the dimple. The depth of the silicon removed by the step of grinding is within the buried plate.

The conductive material is selected for a low contact resistance with Silica. The conductive material is selected from the group consisting of platinum and tungsten.

Depositing a conductive material further comprises depositing the conductive material in-situ by a focused ion beam method. Depositing a conductive material further comprises sputtering the conductive material over the bottom of the semiconductor substrate.

According to another embodiment of the present invention, a method is provided for connecting a floating source of a trench device to a back-side contact for the trench device. The method comprises grinding a back-side of a semiconductor substrate, milling a trench in the back-side of the semiconductor substrate, wherein a vertical trench fill is exposed, and depositing a back-side electrode in-situ by focused ion beam, wherein the conductive material shorts the vertical trench fill to a buried plate.

Grinding the back-side of the semiconductor substrate further comprises grinding a dimple beneath a portion of the trench device, wherein the trench is milled in the bottom portion of the dimple. The depth of the silicon removed by the step of grinding is within the buried plate.

The conductive material is selected for a low contact resistance with Silica. The conductive material is selected from the group consisting of platinum and tungsten.

According to an embodiment of the present invention, a memory device is provided having an accessible source such that device parameters can be determined. The device comprises a dimple ground into a back-side of a semiconductor substrate of the device, a trench milled from the bottom portion of the dimple exposing a portion of a vertical trench fill, and a conductive material connecting the vertical trench fill and a source of the device.

The trench is milled into a portion of the vertical trench fill.

The conductive material is a back-side electrode. The conductive material is a layer covering a portion of the backside of the semiconductor substrate.

A macro design of the memory device is substantially similar to a product line macro design. The memory device dimensions are substantially the same as those of the product line macro design.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The present invention provides a system and method for a back-side contact to a source side of a trench semiconductor device. The back-side contact can be used for device testing after wafer processing. The design of the test device can be substantially the same as a device of the product line. Thus, accurate field effect transistor (FET) device parameters can be determined. Accuracy in this case can be the degree to which the parameters of a test device match the hypothetical parameters for a device that has not been modified for testing.

For testing, a vertical complementary metal-oxide semiconductor (CMOS) device terminal can be connected from a back-side of the wafer. This allows the test device design to be substantially the same as the product line devices while providing a means for accessing a source side of the device for determining device parameters. The method is applicable to any trench DRAM, including planar devices and vertical devices, but is not limited to such devices.

For a vertical trench DRAM device, the method provides a contact to the source of the device. A hole is drilled into the back-side of the wafer exposing a portion of the vertical trench. A relatively low accuracy is needed for drilling, for example, on the order of several nanometers. The vertical trench can be exposed up to any point within a buried plate without negatively affecting the device characteristics. The amount of silicon that can be removed may be different for different devices.

According to an embodiment of the present invention, for the contact to the source of the device, a conductive material can be deposited in the bottom of the hole to short an inner electrode of the vertical trench, which is connected to the source of the device. During probing, the source of the device can be accessed via an n-well pad in the semiconductor substrate.

According to another embodiment of the present invention, the conductive material can be deposited in the form of a metal wire out of the hole to provide a contact to a chuck of the measurement apparatus. Therefore, the source bias can be controlled via the chuck bias. Alternatively, the backside of the device can be coated with a conductive material ex-situ by, for example, physical vapor deposition (PVD) including, inter alia, sputtering, to provide a contact. The choice of conductive material can be determined by its contact resistance with silicon, without further thermal processing that could alter the device parameters. Coating the backside of the device does not negatively affect the device parameters because the substrate and the baseplate have substantially the same potential.

Figure 1:
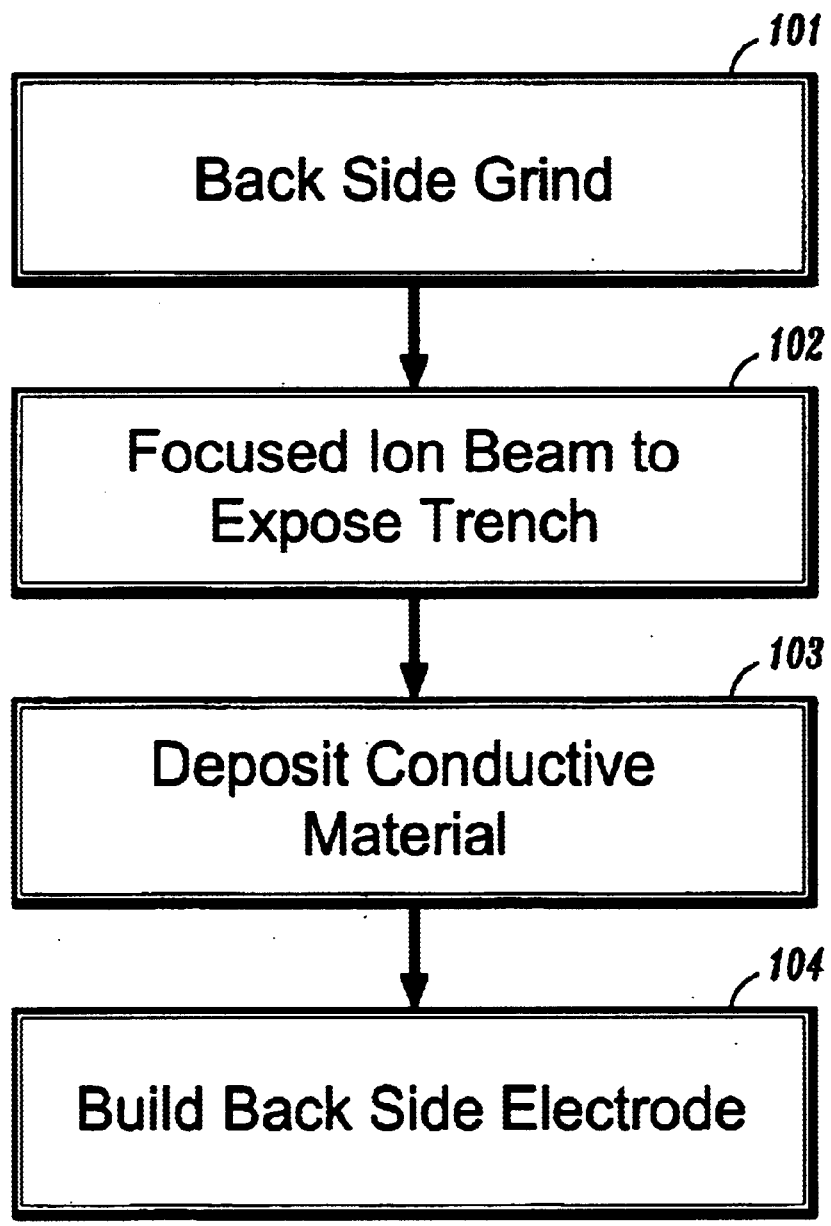
FIG. 1 is a flow chart of a method according to an embodiment of the present invention.

In a back-to-back device test, for example, one or more devices, e.g., three, four or five, c-an be selected for device modeling. Referring to FIG. 1, for each device selected, a backside grind can be performed on the wafer 101. Alternatively, a local dimple grind can be performed. A dimple may provide better mechanical stability than the back-side grind because it removes less Si substrate.

A deep hole is milled from the back-side of the device, exposing the vertical trench. Preferably, the milling can be performed using a focused ion beam (FIB), or alternatively using a dimpler. A wet etch can be used, as opposed to the FIB, after the course hole is formed by the dimpler. The vertical trench is connected to the source of the array device 102.

Using a finely focused ion beam, a FIB method can be used to perform product failure analysis. Dielectric or metal layers can be selectively removed for probing and material analysis of underlying surfaces. Cross-sections of buried circuitry can also be performed with sub-micron accuracy.

The accuracy of the milling, exposing the vertical trench, can be relatively low. It is to be understood that accuracy constraints, such as the amount of vertical trench that can be milled, can vary from one device design to another device design.

The conductive material, for example, nickel, iron, platinum or tungsten, can be deposited to short the vertical trench fill to the buried plate 103. The conductive material can be selected for a relatively low contact resistance with Si, for example, a metal such as nickel. A back-side electrode, or contact to the chuck, can be built to contact the source side of the device directly 104.

Figure 2:
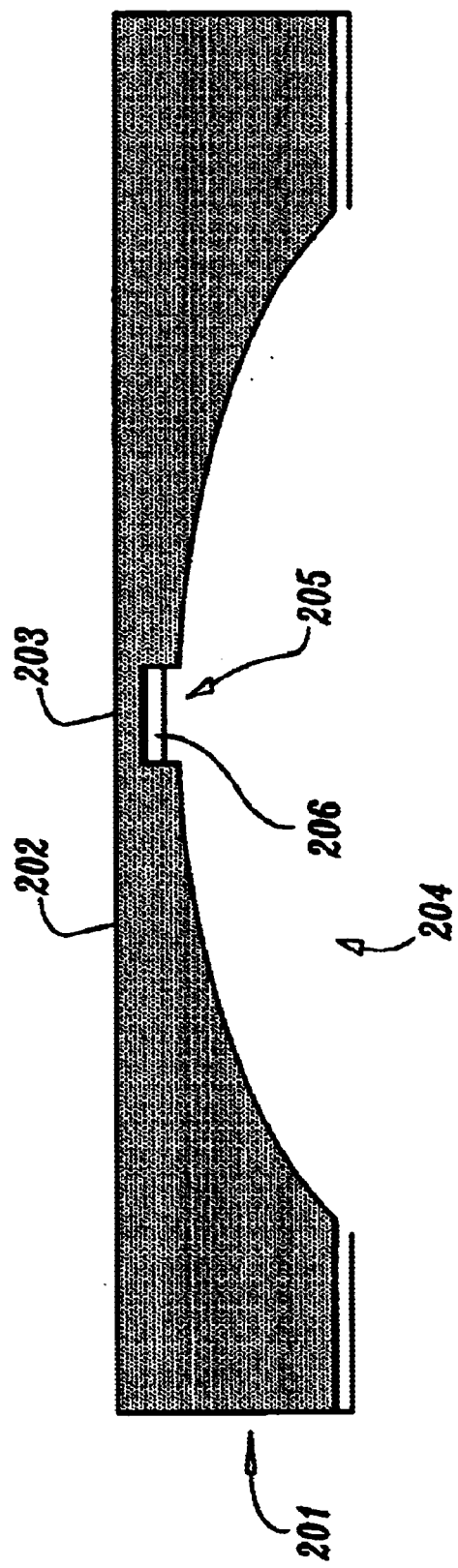
FIG. 2 is a cross-section of an n-well contact according to an embodiment of the present invention.

Referring to FIG. 2 showing a cross-section of a lower portion of a vertical trench DRAM device, a semiconductor substrate 201 is provided, including an n-well contact 202 and an array device 203. The dimple 204 is ground into the semiconductor substrate 201. A box 205 is cut from the bottom of the dimple 204, and a conductive material 206 is deposited to connect (short) the vertical trench fill to the buried plate.

Figure 3A:
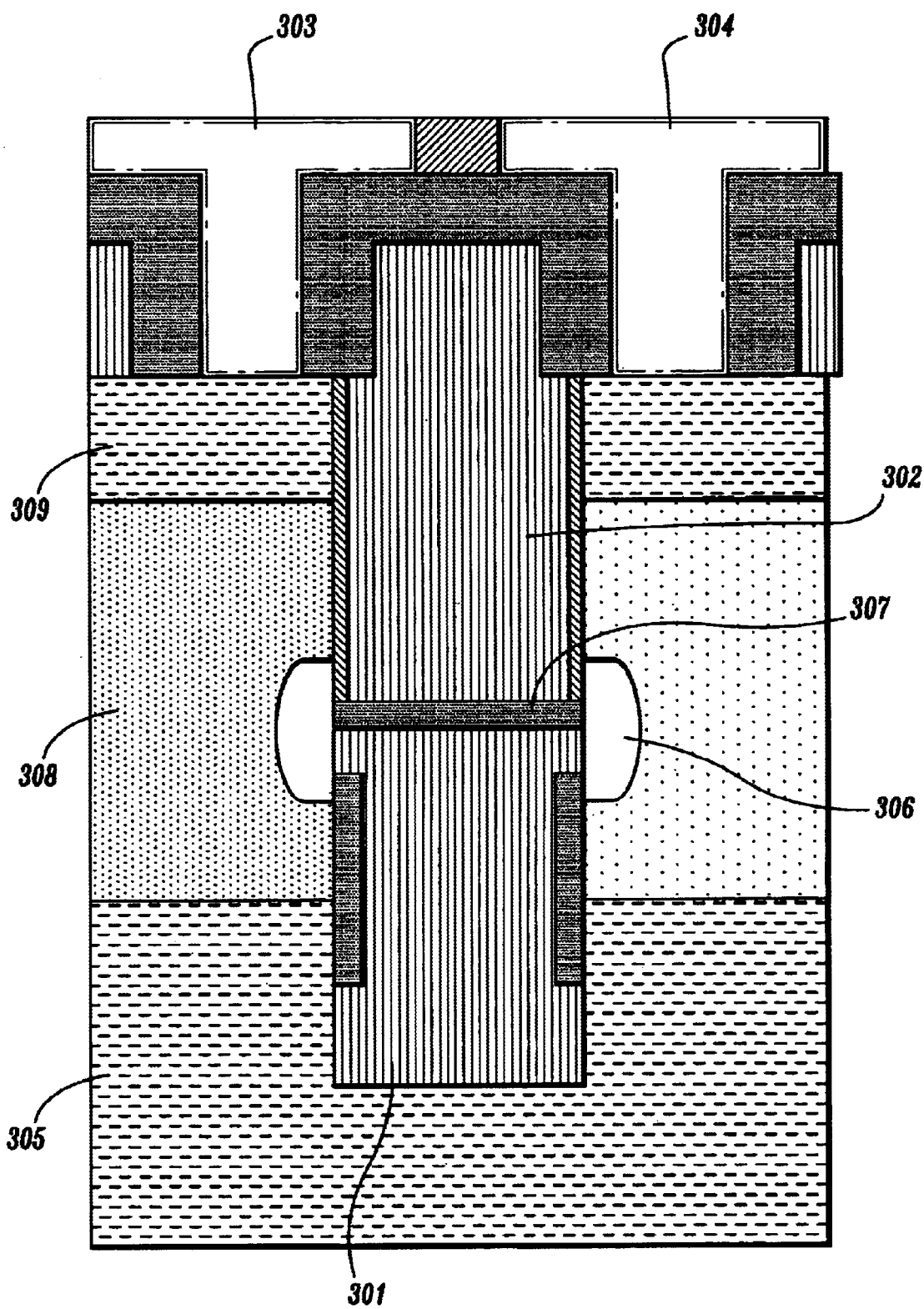
FIG. 3a is a cross-section of a deep trench DRAM according to an embodiment of the present invention.
Figure 3B:
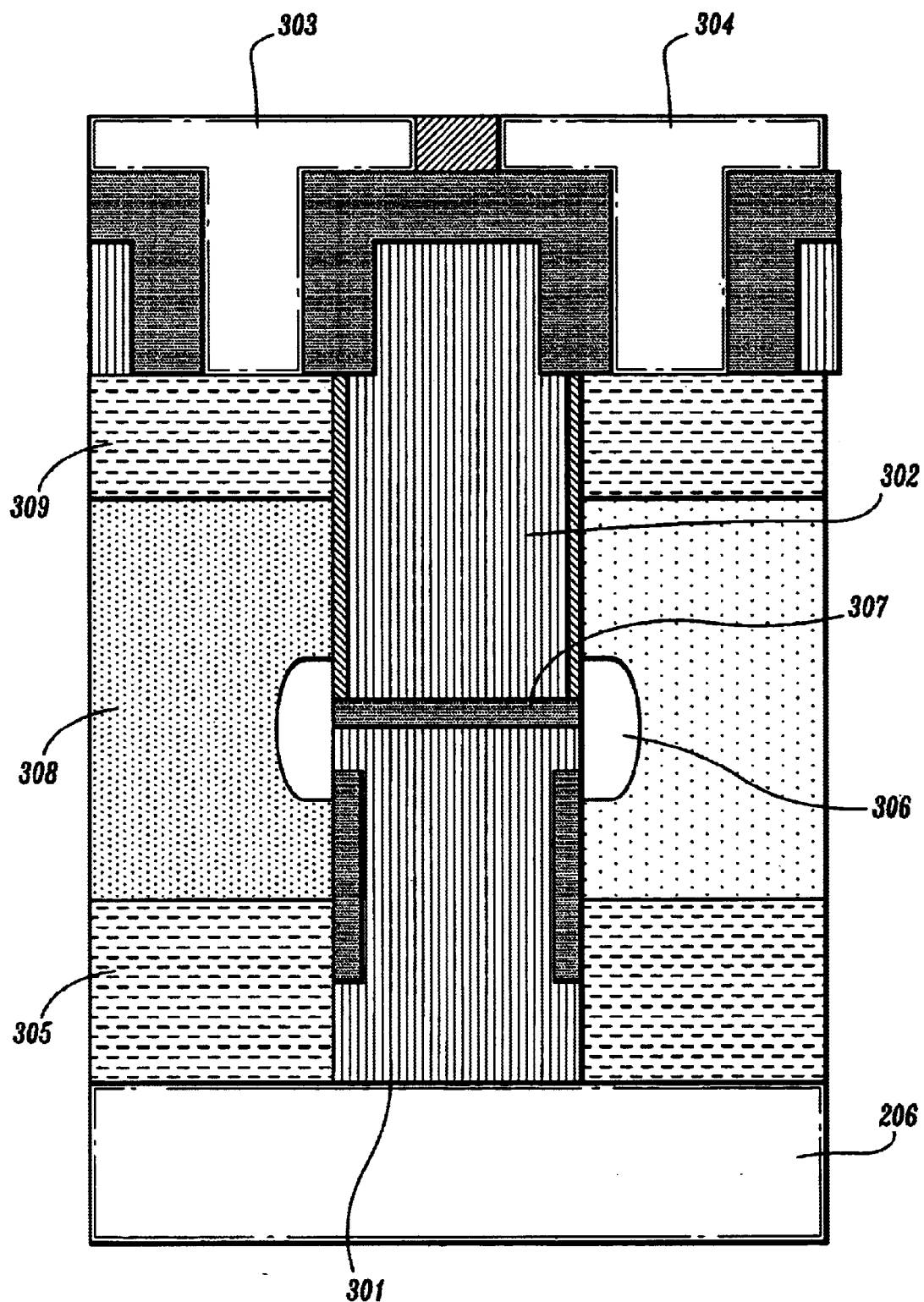
FIG. 3b is a cross-section of a deep trench DRAM including a back-side metal shorting a source to an n-well according to an embodiment of the present invention.

FIGS. 3a–b illustrate an example of a cross-section of a deep trench DRAM device prior to forming a back-side contact and after forming the back-side contact respectively. The deep trench DRAM includes, inter alia, a source 301, a gate 302, drain or bit contacts 303–304. The deep trench DRAM further includes a buried plate 305 and a strap contact 306, both n+ doped. A top trench oxide layer 307 separates the source 301 and gate 302. A p-well 308 separates different deep trench cells. An n+ doped layer 309 is deposited above the p-well 308. The conductive material 206 deposited by, for example, FIB or PVD, shorts the source or deep trench fill 301 to the n-doped buried plate 305.

Having described embodiments for a system and method for a back-side contact to the source side of the device after wafer processing, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A memory device having an accessible source such that device parameters can be determined, comprising:
   a dimple ground into a back-side of a semiconductor substrate of the device;
   a trench milled from the bottom portion of the dimple exposing a portion of a vertical trench fill; and
   a conductive material connecting the vertical trench fill and a buried plate of the device, wherein the conductive material is a layer covering a portion of the back-side of the semiconductor substrate.

2. The system of claim 1, wherein the trench is milled into a portion of the vertical trench fill and the buried plate.

3. The system of claim 1, wherein the conductive material is a back-side electrode.

4. The system of claim 1, wherein a macro design of the memory device is substantially similar to a product line macro design.

5. The system of claim 4, wherein the memory device dimensions are substantially the same as those of the product line macro design.

* * * * *